United States Patent [19]

Solheim

[11] Patent Number: 5,219,784
[45] Date of Patent: Jun. 15, 1993

[54] SPACER FORMATION IN A BICMOS DEVICE

[75] Inventor: Alan G. Solheim, Puyallup, Wash.

[73] Assignee: National Semiconductor Corporation, Santa Clara, Calif.

[21] Appl. No.: 503,491

[22] Filed: Apr. 2, 1990

[51] Int. Cl.$^5$ .............................. H01L 21/70
[52] U.S. Cl. .................................... 437/57; 437/31; 437/162; 437/200; 437/44; 148/DIG. 9; 257/565
[58] Field of Search ................. 437/56, 57, 59, 34, 437/162, 233, 192, 200; 148/DIG. 9; 357/43

[56] References Cited

U.S. PATENT DOCUMENTS

| | | | |
|---|---|---|---|
| 3,955,269 | 5/1976 | Magdo et al. | 437/34 |
| 4,484,388 | 11/1984 | Iwasaki | 437/59 |
| 4,507,847 | 4/1985 | Sullivan | 437/31 |
| 4,536,945 | 8/1985 | Gray et al. | 437/57 |
| 4,609,568 | 9/1986 | Koh et al. | 437/60 |
| 4,764,480 | 8/1988 | Vora | 437/56 |
| 4,927,775 | 5/1990 | Alvarez et al. | 437/56 |
| 4,927,776 | 5/1990 | Soejima | 437/59 |
| 4,960,726 | 10/1990 | Lechaton et al. | 437/162 |
| 4,965,200 | 10/1990 | Iwasaki | 437/59 |
| 5,001,081 | 3/1991 | Tuntasood et al. | 437/31 |
| 5,021,354 | 6/1991 | Pfiester | 437/56 |
| 5,045,483 | 9/1991 | DeLong et al. | 437/162 |

OTHER PUBLICATIONS

IBM Technical Disclosure Bulletin, vol. 23, No. 4, Sep. 1980, pp. 1487–1488, New York; H. H. Berger et al.
Ghandhi, *VLSI Fabrication Principles*, John Wiley & Sons, 1983, pp. 493–494.
Brassington et al., *IEEE Trans. Elect. Devices* (1989) pp. 712–719.
Momose et al., *IEDM Transactions* (Feb. 1985) p. 217.
Kapoor et al., "A High Speed High Density Single-Poly ECL Technology for Linear/Digital Applications," 1985 Custom Integrated Circuits Conference.
Gomi et al., *IEDM Technical Digest* (1988) pp. 744–747.
Ghandhi, *VLSI Fabrication Principles, Silicon and Gallium Arsenide*, John Wiley & Sons, New York, 1983, pp. 383–384.
Irene et al., *J. Electrochem. Soc.*: Solid-State Science and Technology, Jul. 1978, pp. 1146–1151.

*Primary Examiner*—Mary Wilczewski
*Attorney, Agent, or Firm*—Townsend and Townsend

[57] ABSTRACT

A contact structure and a method for fabrication is disclosed for a semiconductor device that includes a plurality of semiconductor regions along the surface of the device, each region having a top surface and at least a sidewall surface, where a first part of the semiconductor regions are of a first conductivity type and a second part of semiconductor regions are of a second conductivity type. Select dielectric spacers are formed along the sidewalls of the select semiconductor regions of first conductivity type while a refractory metal such as titanium, molybdenum or tungsten is used to form contact on the sidewalls of the semiconductor regions of second conductivity type. This structure is most advantageous in bipolar, CMOS and BiCMOS transistor structures as it allows the formation of the sidewall spacers on emitter/gate contacts while having local metal interconnects with the reactive metal on the sidewall of the select base/source/drain contacts.

7 Claims, 5 Drawing Sheets

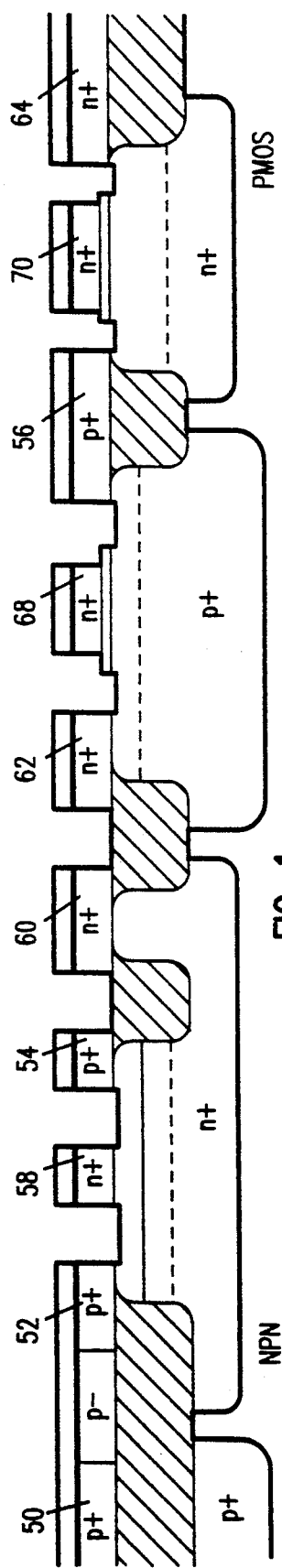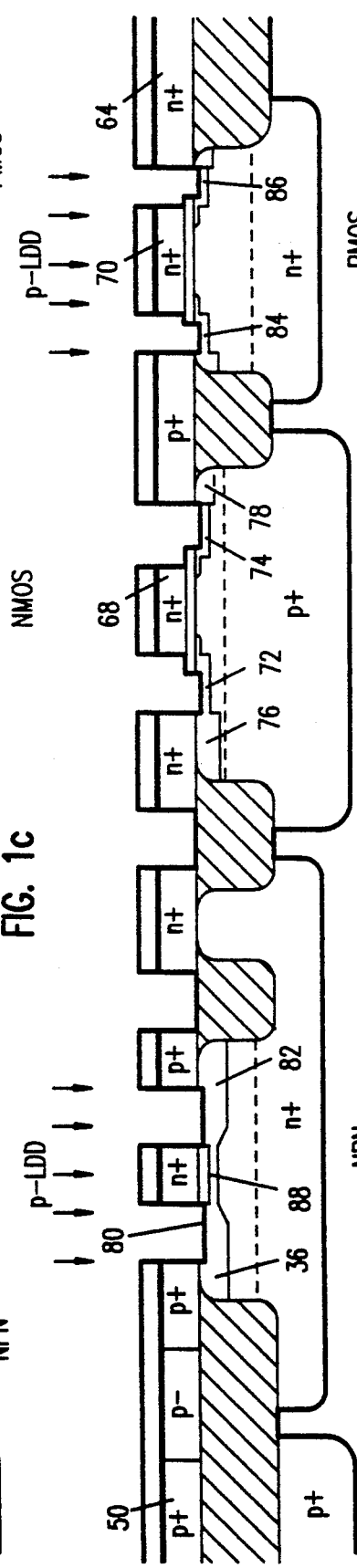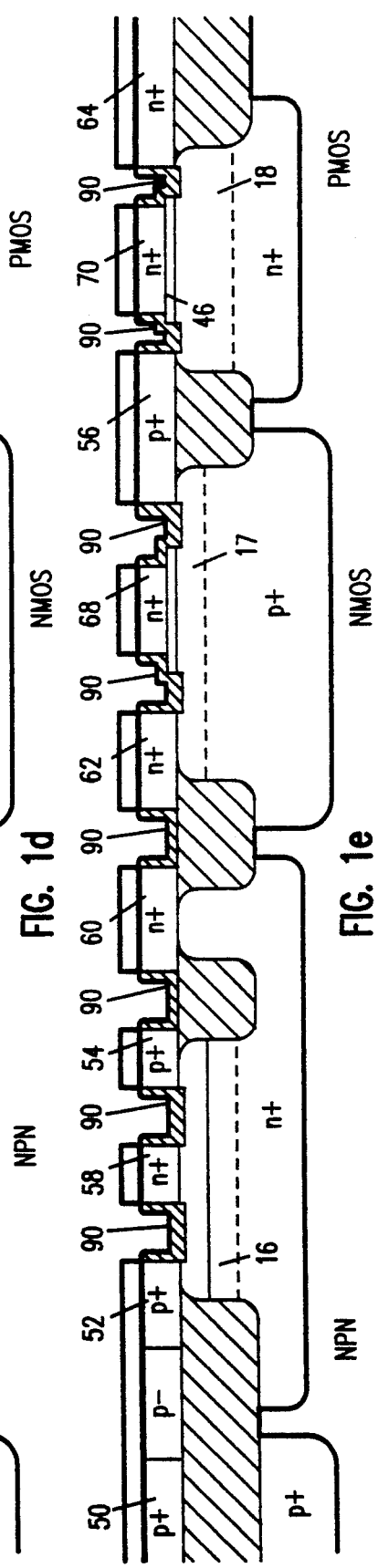

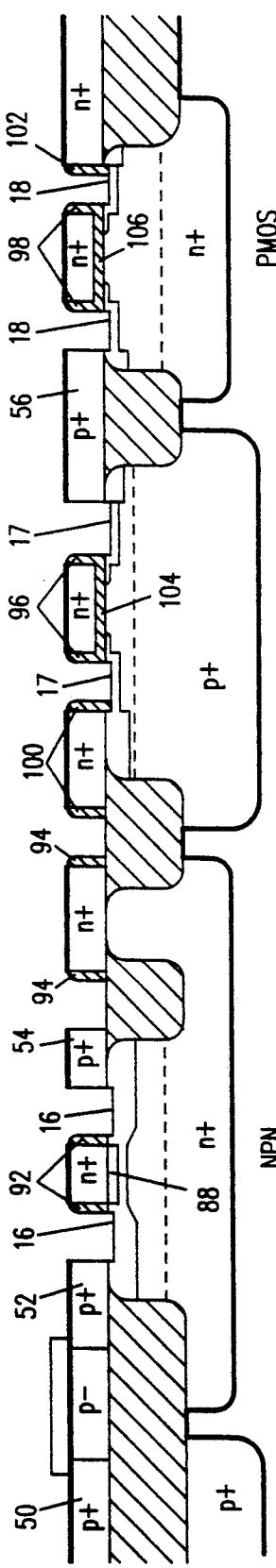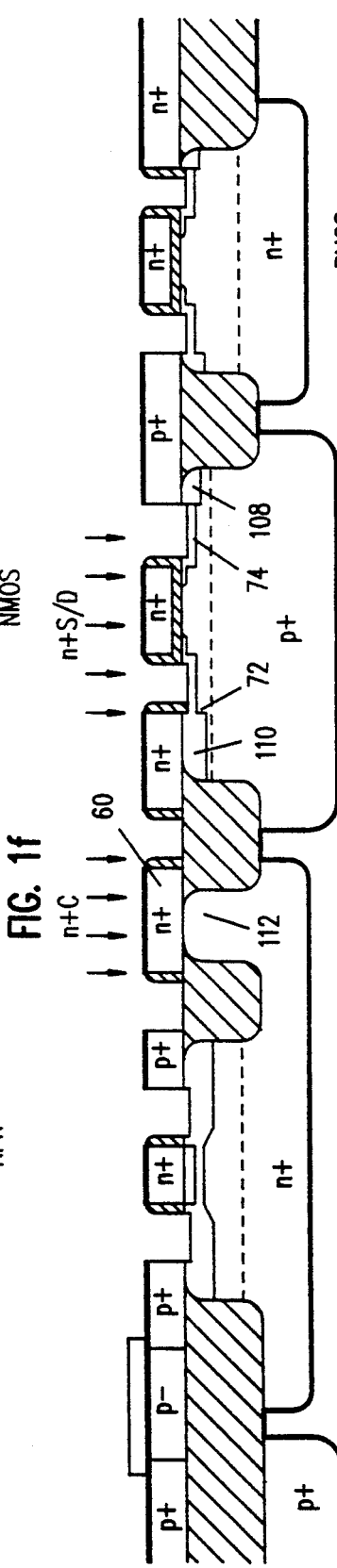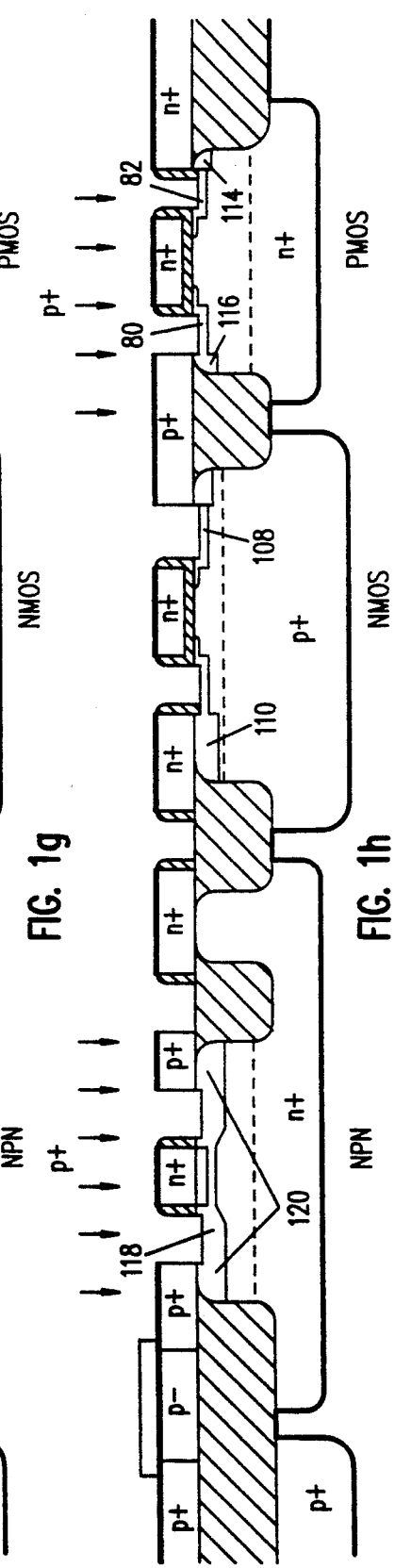

SPACER FORMATION IN A BICMOS DEVICE

BACKGROUND OF THE INVENTION

The present invention relates generally to integrated circuits and their fabrication, and in particular, to a device with selective spacer formation on a first type of conductive material and local silicide interconnect formation on a second type of conductive material.

The use of a polysilicon layer for local interconnect has been reported in the literature for both bipolar and field effect (otherwise known as metal oxide semiconductor or "MOS") technologies. In bipolar processes, a polysilicon layer can be used to electrically contact base, collector, and emitter regions of bipolar transistors. In MOS technologies, a polysilicon layer can be used to electrically contact the source-drain regions of the MOS transistors and form the gates of MOS transistors. By suitable patterning of the polysilicon layer forming the buried contacts, a local interconnect may be formed. Global interconnects are then formed by contacting the polysilicon layer using conventional metal interconnects.

Since the number of metal layers which may be formed on a given portion of a wafer is limited, the use of a polysilicon layer for local interconnect allows a metal layer that was formerly used for local interconnect to be employed as an additional global interconnect layer. In addition to the advantages in layout provided by an additional global interconnect layer, the use of a polysilicon layer to form device contacts also results in an improvement in transistor performance through reduction in device parasitic areas (e.g., the extrinsic base area in bipolar transistors). It also results in simplification of contact etch technology for shallow junctions where very high etch selectivity to the substrate is required. This is particularly important in processes where dielectric planarization is performed before contact etch, because the thickness nonuniformity of the dielectric creates a substantial risk of etching into the shallow junction. By using a polysilicon layer to contact the shallow junction, metal contacts may be made to the polysilicon layer rather than the shallow junction, and the risk of overetching is reduced.

Recent processes also provide for fabricating metal silicide layers on desired components of bipolar circuits by a process that is self-aligned to the components. These processes have been modified to limit dopant movement from polysilicon into the silicide, to eliminate metallic contaminants from the surface of the field oxide surrounding active device areas, and to eliminate the need for masking/etching the metal silicide. One process utilizing some of the above techniques is taught by Koh et al. in U.S. Pat. No. 4,609,568.

Advanced complementary MOS (CMOS), bipolar/CMOS (BiCMOS), MOS, and bipolar devices have very high packing densities. The formation of spacers on the sidewalls of, for example, emitter/gate polysilicon regions on a substrate are essential in order to isolate these regions. Some processes form spacers on the sidewalls of the emitter/gate polysilicon patterns by depositing a uniform oxide where vertical polysilicon sidewalls have been created. A plasma etch is then performed to selectively remove oxide from horizontal surfaces of the polysilicon, but not the vertical sidewalls. This step may be followed by formation of metal silicide contacts.

While meeting with some success, the above processes have met with certain limitations. For example, contact resistance is often increased because only the top portion of the polysilicon is provided with a silicide region.

From the above, it is seen that an improved device with sidewall spacers and a method of fabrication thereof is desired.

SUMMARY OF THE INVENTION

The present invention offers a method of forming sidewall oxide on selected vertical sidewalls of a polysilicon layer. In some embodiments the process does not require a masking step to remove the spacer oxide from other vertical sidewalls. In one embodiment, oxide is removed from the sidewall of p-type polysilicon while maintaining oxide on the sidewalls of n-type polysilicon sidewalls. The invention provides for differential oxide growth on n-type polysilicon as compared to p-type polysilicon. The process reduces the need to control oxide uniformity and comformality, while resulting in a local interconnect with silicided sidewalls on selected polysilicon sidewalls.

According to the invention, a contact structure for a semiconductor device is fabricated that includes a plurality of semiconductor regions along the surface of the device, each region having a top surface and at least a sidewall surface, where some of the semiconductor regions are intrinsic or of a first conductivity type and the remaining semiconductor regions are of a second conductivity type. Dielectric spacers are maintained along the sidewalls of the semiconductor regions of first conductivity type, but not along regions of the second conductivity type. A refractory metal, such as titanium, molybdenum or tungsten, is used in some embodiments to form contacts on the sidewalls of the semiconductor regions of second conductivity type.

The structure provided herein will have applications in bipolar, MOS, and BiCMOS transistor structures, for example, as it allows the formation of the sidewall spacers on selected polysilicon contacts, gates, emitters and the like without the need for additional masking steps. This process avoids a subsequent masking step to selectively remove any excess dielectric material to form the desired sidewall spacers.

Also according to this invention, a method is disclosed for fabricating a spacer structure that includes the steps of forming a first region of a semiconductor material with a first conductivity type that has a top surface and a sidewall, forming a second region of a semiconductor material of second conductivity type that has a top surface and a sidewall, forming a dielectric layer on the device, including the first and second regions, and then removing the excess dielectric layer from the device except where on sidewalls of the first region. One specific embodiment of this invention forms the spacer structure in a method that allows the subsequent metal interconnect to be self-aligned. This method further includes the steps of depositing a metal on the device and reacting the metal with the semiconductor material desired, and then removing the excess metal in some embodiments. In one embodiment, these steps are part of the overall process used to fabricate bipolar, field effect, CMOS and/or BiCMOS based integrated circuit devices.

An important advantage of the present invention is the reduction of base contact resistance in bipolar devices and source/drain contact resistance in MOS devices with the use of self aligned silicide formation. Since the spacer is formed only around the emitter/gate of a transistor, silicide forms on the sidewall of, for example, the base contact, source contact, or drain contact polysilicon. This reduces the resistance and required overlap of the base/source/drain polysilicon contacts onto the active region and results in smaller device areas. Further device performance improvements are obtained by way of silicide formation along horizontal surfaces of an active area of a device such as a base, source, or drain of a transistor.

It is another advantage of the present invention to eliminate the spacer on silicided polysilicon used for local interconnect which increases the area which becomes silicided. This results in a reduction of the resistance in the interconnect and is particularly significant for sub-micron geometries. It is another advantage of the present invention to improve device performance by reducing the critical feature size below that defined by photolithography as the thermal oxide spacer encroaches on the emitter/gate.

Other advantages of the present invention will become apparent after having read the following detailed description of the preferred embodiments which are illustrated by the various figures.

BRIEF DESCRIPTION OF THE DRAWINGS

FIGS. 1a to 1j illustrate the steps of forming a combination bipolar/CMOS device according to a particular embodiment of the present invention.

DETAILED DESCRIPTION OF THE PREFERRED EMBODIMENTS

The description which follows is directed to one particular embodiment of the present invention suitable for a BiCMOS process. It should be understood however, that the present invention is not limited thereto and may be employed in any semiconductor fabrication process where low contact series resistance and sidewall spacer formation are desired.

Figure 1A:
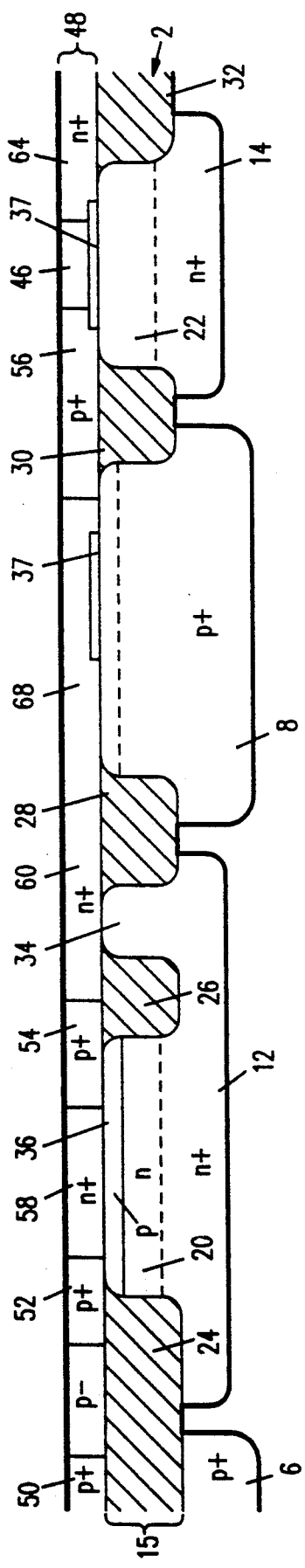

FIG. 1a shows a silicon substrate 2 after having undergone preliminary processing. For example, silicon substrate 2 has been processed to form an bipolar NPN region, an NMOS region, and a PMOS region, including p+channel stop 6 and a p+buried layer 8 in NMOS region. The NPN region is intended to be used for forming an NPN bipolar transistor, whereas the NMOS region is intended to be used for forming an N channel MOS device, and the PMOS region is intended to be used for forming a P channel MOS device If desired, the bipolar region may be used to form a PNP device by interchanging the conductivity type of the substrate dopants. Other possible applications include, for example, the formation of P-N junction diodes.

Silicon substrate 2 is formed of a p-type material. Consequently, NPN bipolar region and PMOS region have formed therein arsenic doped n+buried layers 12 and 14, respectively. N+buried layers 12 and 14 may be formed, for example, by the process disclosed in U.S. Pat. No. 3,648,125 to Douglas L. Peltzer which is incorporated herein by reference for all purposes. An epitaxial silicon layer 15 having a thickness of about 1 μm is grown on the substrate. The epitaxial layer includes N wells 20 and 22, respectively, formed by diffusion of an appropriate n-type impurity, such as phosphorous, into epi region 15 according to well known techniques. N+buried regions 12 and 14 typically have an impurity concentration of approximately $1 \times 10^{20}$ atoms/cm$^3$ and are approximately 1 μm thick, whereas N regions 20 and 22 typically have an impurity concentration of approximately $1 \times 10^{16}$ atoms/cm$^3$ and a thickness of approximately 0.8 μm.

Isolation between the devices is provided by oxide regions 24, 26, 28, 30 and 32. The oxide regions are formed by means well known to those of skill in the art. For example, a silicon dioxide layer may be thermally grown on the surface of the substrate 2 by placing substrate 2 in a steam environment after masking with an oxide/nitride sandwich at a temperature of approximately 900° C. for 30 minutes. As a result, NPN region is electrically isolated from NMOS region by field oxide region 28, and NMOS region is electrically isolated from PMOS region by field oxide region 30. Field oxide region 26 separates NPN region into a collector contact region 34 and a base/emitter region 36. Alternatively, the field oxide regions are formed by the well known LOCOS process.

A grown screen oxide layer having a thickness of about 250 Å is then formed on the device surface and a mask is formed, exposing only the sink region 34. A sink implant using an implant energy of between about 100 and 190 keV with a dose of between about $1 \times 10^{14}$ and $1 \times 10^{16}$ using phosphorus as a dopant. The resulting dopant concentration in the sink region 34 is between about $1 \times 10^{19}$ and $1 \times 10^{20}$/cm$^3$. The screen mask is then removed and a separate mask/ion implantation is performed to dope the channel (well) region of the PMOS transistor to a concentration of between about $2 \times 10^{16}$ and $5 \times 10^{16}$ and using phosphorus as a dopant. In preferred embodiments, the implant energy used for the PMOS region is between about 50 and 150 keV with energy of between about 50 and 100 keV preferred. The resulting net dopant concentration in the epitaxial channel region of the n-well 22 is between about $2 \times 10^{16}$ and $5 \times 10^{16}$/cm$^3$. The sink region 34 and n-well 22 are then annealed and driven in by heating with a conventional thermocycle in nitrogen.

A mask is then formed on the surface of the device which exposes only the NMOS and PMOS transistor regions. This mask is used for threshold voltage implant. The implant is used to adjust the threshold voltage of the NMOS and PMOS transistors as necessary, typically to between about ±0.6 and 1.0 volts. In preferred embodiments, the threshold voltage implant is an implant of boron at a dose of between about $1 \times 10^{13}$ to $5 \times 10^{13}$ and preferably at 50 KeV. The threshold voltage implant sets the threshold of the NMOS and PMOS transistors. In preferred embodiments, the threshold voltage implant ultimately provides transistors with threshold voltages of about 0.75 v for NMOS and −0.85 v for PMOS.

The screen oxide is stripped and a thin layer of silicon dioxide is formed on the exposed surfaces of substrate 2. The silicon dioxide layer is used to form the gate oxide 37 for the MOS devices. In this embodiment, it has a thickness in the range of from approximately 150 Å to 300 Å, although the thickness range may vary depending on the desired operating characteristics of the MOS devices. The gate oxide layer is then masked and etched for formation of the gate oxide regions on the NMOS and PMOS transistors.

Polycrystalline silicon layer 48 is deposited as a blanket coating by CVD over the remaining portions of gate oxide 37 and the exposed areas of silicon substrate 2.

Polycrystalline silicon layer 48 preferably has a thickness of from approximately 2000 Å to 4000 Å.

A mask is formed exposing the base regions of the bipolar transistor and a p-type implant is performed. Dopants from the poly are then diffused into the underlying monocrystalline silicon to form the base region of the bipolar transistor.

Thereafter, a mask is formed which exposes selected regions which will eventually be a portion of the resistor 50, the base contacts 52, 54, and well tap contact 56. The regions are preferably doped p+ to a concentration of between about $1 \times 10^{19}$ and $1 \times 10^{20}$ using boron. Next, the p+ mask is removed and an n+ mask is formed to expose openings to define emitter contact 58, collector contact 60, NMOS gate 62, and PMOS contact 64. Polycrystalline silicon layer 48 then is implanted with an n-type impurity, such as arsenic, and the ions are implanted with sufficient implant energy and dose to provide a concentration of from approximately $1 \times 10^{19}$ and $1 \times 10^{20}$.

Figure 1B:
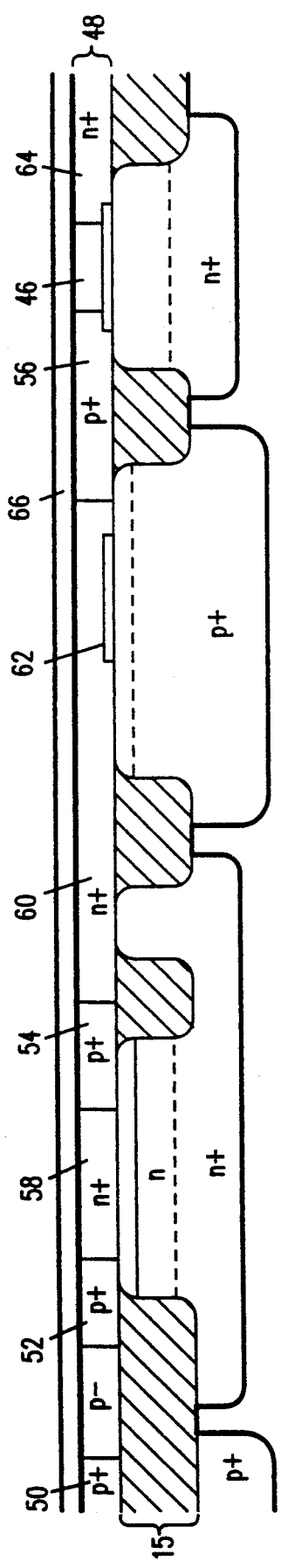

As shown in FIG. 1b, the remaining portions of the mask are removed, and a layer of silicon nitride 66 having a thickness of between about 1,000 Å and 2,000 Å is deposited across the entire upper surface to provide an oxidation mask. The structure is then annealed at a temperature of from approximately 900° C. to 950° C. for approximately 30 minutes in a nitrogen atmosphere to diffuse the dopants through the implanted portion of polycrystalline silicon layer 48.

Thereafter in FIG. 1c, a mask is formed over nitride layer 66 to protect the contact of the base 52, 54, emitter contact 58, and collector 60 of the bipolar transistor, and the source contacts 56, 64, gates 68, 70 and drain contacts 62, 56 of the NMOS and PMOS transistors, respectively. The device is plasma etched and the exposed portions of polysilicon then are over-etched until they are removed.

Next, the mask is removed, and another photoresist mask is formed to expose the source and drain of the NMOS transistor. Then, an n-type lightly doped drain (LDD) implant is performed with phosphorous ions on the exposed regions with an implantation energy of 40 KeV to a concentration of from approximately $1 \times 10^{17}$ to $1 \times 10^{19}$. This forms N implant areas 72 and 74 and diffuses buried contacts 76, 78 in the NMOS region.

Next, as shown in FIG. 1d, the mask is removed, and a photoresist mask is deposited over substrate 2 forming openings over base/emitter region 36 and PMOS region. Then, a p-type implant is performed for PMOS region and the link implant for base/emitter region 36, preferably with boron difluoride at an implantation energy of 50 KeV to a concentration of from approximately $1 \times 10^{17}$ to $1 \times 10^{19}$. This forms P implant areas 80 and 82 in the base region of the bipolar transistor and P implant areas 84, 86 in the PMOS region. The n-type emitter 88 is diffused from the overlying emitter contact. Thereafter, the mask is removed.

Next, as shown in FIG. 1e, a conformal silicon dioxide layer 90 is grown using steam between about 800° and 900° C., and preferably about 800° C., to grow a thickness of oxide from approximately 1,000 to 3,000 Å, preferably 2,000 Å. As shown in the figure, oxide covers the sidewalls of the base contacts, the collector contact, and the emitter contact, as well as the exposed horizontal upper portion of the base in the bipolar transistor. A small amount of additional oxide growth may also occur on the upper surface of the field oxide region. In the MOS device, oxide covers the sidewalls of the source and drain contacts as well as the exposed upper portion of the source and drain regions.

Heavily doped n+ type silicon grows an oxide up to eight times as thick as that on P doped polysilicon or single crystal silicon. This phenomenon is used to form selective spacers on the sidewalls of n+ emitter contact 58 and gate contacts 68, 70, and polysilicon, but not on the sidewall of the P doped base contact 52, source contact 54 or drain contact 46 polysilicon. Thick oxide is also formed on n+ collector contact 60, as well as MOS contacts 62 and 64. An oxide etch in hydrofluoric acid removes substantially all of the undesired oxide on the p+ doped polysilicon and contacts 52, 54, 56 as well as the horizontal upper portion of the epi-layer in the extrinsic base region and source and drain regions of the MOS transistors. While hydrofluoric acid is used to etch the oxide in preferred embodiments, isotropic plasma etch chemistries and the like may also be used with beneficial results. The etch is timed to remove oxide on p doped poly while leaving oxide on n+ type poly. The time required for oxidation of the oxide will vary depending upon the oxide thickness, but may readily be determined by those of skill in the art.

As seen in FIG. 1f, the remaining oxide 90 forms the spacer sidewalls 92, 94, 96, 98, 100 and 102 of emitter contact 58, collector contact 60, gates 68, 70 and NMOS drain 62 and PMOS source 64, respectively. These spacer sidewalls 92, 94, 96, 98, 100 and 102 will eventually separate the emitter/gate silicide from the base/drain/source silicide. The remaining oxide on the sidewalls of n+ has a thickness of between 750 Å and 2,500 Å, with a thickness of about 1,500 Å preferred.

This process avoids an extra process step of using a mask to selectively remove polysilicon sidewall spacers. This elimination of the spacer on the soon to be silicided polysilicon used for local interconnect increases the area which becomes silicided, resulting in a reduction of the resistance. This also significantly reduces the required size of the individual transistor, thus allowing greater density. Finally, the thermal oxide sidewalls 92, 96 and 98 encroach on the emitter 88 and gates 104, 106 thereby reducing the critical feature size below that defined by photolithography, thereby further improving device performance.

In the next step, shown in FIG. 1g, a mask is formed to exposed source/drain region of the NMOS transistor. An n-type ion implant then is performed, preferably with arsenic, at an implantation energy of about 20 to 40 KeV to a concentration of approximately $10^{18}$ atoms/cm$^2$ to heavily dope N implant areas 72 and 74 for forming the source 108 and drain 110 of the NMOS device, and to form a heavily doped N implant area in the collector contact 60 of the bipolar device. Afterwards, substrate 2 is optionally annealed to form an n+ collector contact junction 112 in bipolar region, and a contiguous n+ source 108 and n+ drain 110 in NMOS region.

Similarly, as shown in FIG. 1h, a mask is formed to expose openings over the PMOS region and the base of the bipolar transistor. A p-type ion implant is performed to provide a concentration of approximately $10^{17}$ to $10^{19}$ atoms/cm$^2$ to heavily dope P implant areas 80 and 82 for creating the source 114 and drain 116 of the PMOS device. Substrate 2 is then annealed at a temperature of 900° for approximately 15 minutes to form a contiguous base 120 in NPN region, a p+ source 108 in NMOS region, and a p+ drain 116 in PMOS region.

Figure 1I:
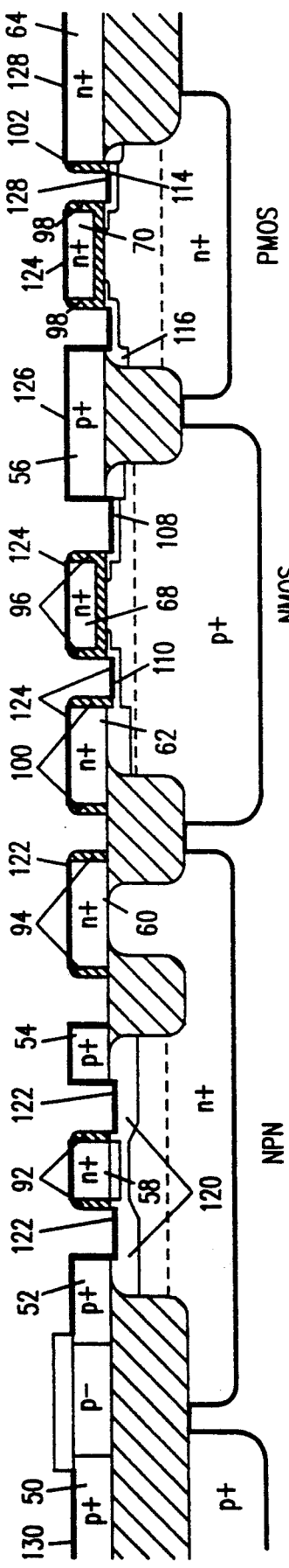

Next, a layer of refractory metal such as titanium, molybdenum, tantalum, tungsten or the like, is deposited across the surface of the device. Using means well known to those of skill in the art, the layer is heated to form metal silicide in regions where the deposited metal is in contact with polysilicon. Remaining unreacted metal is then etched away from the device, leaving a structure as shown in FIG. 1i. As shown therein, bipolar polysilicon base contacts 52, 54 are covered with silicide metallic (i.e., containing metal) regions 112 such as metal silicide regions across their horizontal upper surfaces and along their vertical side walls. In addition, silicide 122 extends from the base contact sidewall along the surface of the monocrystalline base 120 up to the emitter sidewall oxide 92. The n+emitter 58 and collector 60 contacts, however, are covered only on the top surface of the contact extending to the side wall oxide 92, 94, respectively. The silicide 124 on the NMOS polysilicon drain contact 62 and gate contacts 68, 70 also are covered only on the top surface up to the sidewall oxides 100, 96, 98, respectively. Silicide 124 is also formed on the monocrystalline source 110 between the sidewall oxide spacers 100 and 96 of the source 110 and the gate 104, respectively.

The polysilicon well tap 56 also is covered with silicide 126 which covers both the vertical sidewalls and horizontal upper surface of contact 56. Additionally, silicide 126 extends across the upper surface of the NMOS and PMOS transistors up to the of the transistor gates sidewall oxide 96, 98. The PMOS source contact 64 includes silicide 128 across its horizontal upper surface to its vertical sidewall oxide 102 and across the horizontal surface of source 114 up to the gate sidewall oxide 98. Also included is silicide 130 on resistor contact 50.

Figure 1J:
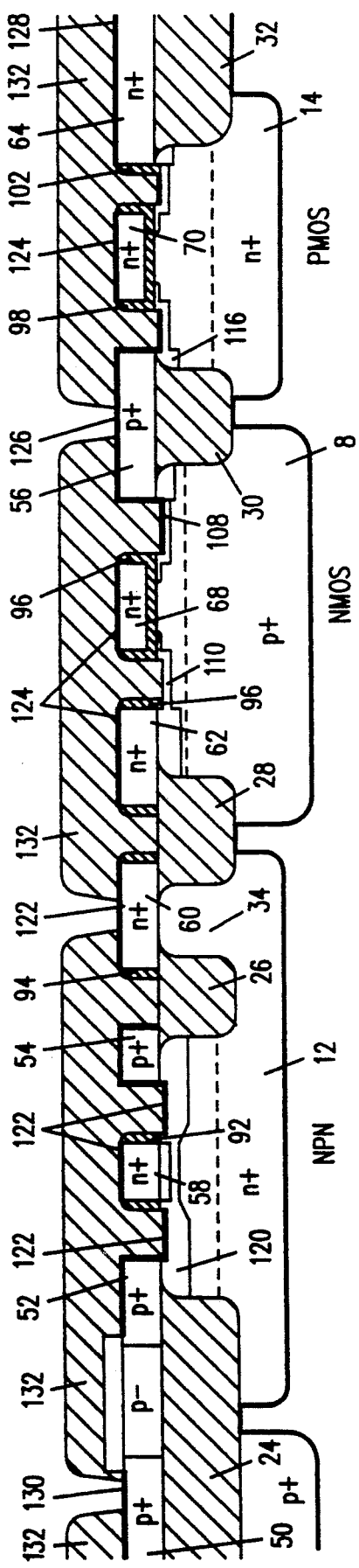
Figure 2:
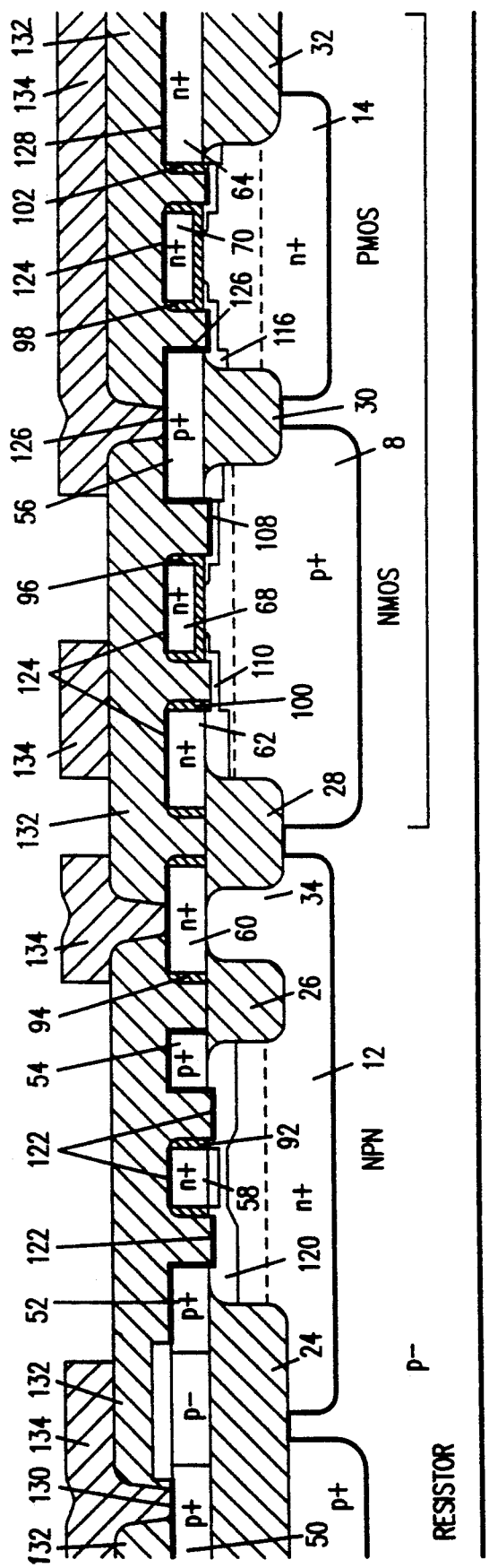
FIG. 2 is a cross-sectional view of a completed BiCMOS integrated circuit structure.

The structure may be subjected to further wellknown integrated circuit processes to create additional layers of interconnections. For example, as illustrated in FIG. 1j, passivating material 132 may be deposited across the entire upper surface of the integrated circuit, openings formed therein, and a layer of metal deposited thereon to provide connections 134 to the silicide regions shown. An example of a completed structure according to the invention is illustrated in FIG. 2.

The foregoing has been a description of the preferred embodiment. For example, the dopant types of the various devices could readily be reversed. Still further, although specific times, temperatures, thicknesses, dopant types, and materials have been described for purposes of illustrating the invention, these are set forward to enable a full understanding of the invention, and are not intended to limit the invention. The scope of the invention may be ascertained from the appended claims.

What is claimed is:

1. A method of constructing a first level contact structure on a BICMOS device having a PMOS transistor region and an NMOS transistor region on a substrate, the method comprising the steps of:
    a) masking and implanting a polysilicon layer with an n type dopant;
    b) masking and implanting said polysilicon layer with a p type dopant;
    c) depositing a nitride layer on the substrate;
    d) etching the polysilicon layer for forming a plurality of openings, an n-type gate on each of said PMOS transistor region and said NMOS transistor region and a p-type contact disposed on said substrate between said NMOS transistor region and said PMOS transistor region;
    e) forming a thermal oxide layer in said openings, said thermal oxide layer thicker on said n type polysilicon than on said p type polysilicon;
    f) etching said oxide so that said oxide on sidewalls of said p type polysilicon is substantially removed while leaving an effective amount of oxide on sidewalls of said gates to form spacers for isolation of said sidewalls of said n type polysilicon; and
    g) forming a silicide layer on said device, said silicide layer extending continuously from a first of said spacers on an active region of said NMOS transistor region, along sidewalls and an upper surface of said contact and to a second of said spacers on an active region of said PMOS transistor region.

2. The method according to claim 1 wherein said oxide forming means is an oxidation at about 800° C. in steam.

3. The method according to claim 1 wherein said etching of said oxide is performed using hydrofluoric acid.

4. The method according to claim 1 wherein the step of forming a silicide layer comprises the steps of:
    a) depositing a metal on said device;
    b) performing a first reaction of said metal with said polysilicon; and
    c) removing said unreacted metal.

5. The method according to claim 4 further comprising the step of performing a second reaction of said metal with said polysilicon.

6. The method according to claim 4 wherein said metal is from a group consisting of titanium, tungsten, cobalt, chromium, nickel, palladium, platinum, tantalum, vanadium, and molybdenum.

7. The method according to claim 1 wherein the n type regions further comprise an emitter contact, and a collector contact, and the p type regions further comprise a base contact, a source contact, and a drain contact.

* * * * *